United States Patent
Indrakanti et al.

(10) Patent No.: US 9,224,618 B2
(45) Date of Patent: Dec. 29, 2015

(54) METHOD TO INCREASE MASK SELECTIVITY IN ULTRA-HIGH ASPECT RATIO ETCHES

(75) Inventors: Ananth Indrakanti, Fremont, CA (US); Rajinder Dhindsa, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 324 days.

(21) Appl. No.: 13/352,138

(22) Filed: Jan. 17, 2012

(65) Prior Publication Data

US 2013/0180951 A1   Jul. 18, 2013

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/311* | (2006.01) |
| *H01L 21/027* | (2006.01) |
| *H01L 21/3065* | (2006.01) |
| *H01L 21/31* | (2006.01) |
| *H01J 37/32* | (2006.01) |

(52) U.S. Cl.
CPC ..... *H01L 21/31116* (2013.01); *H01J 37/32091* (2013.01); *H01L 21/027* (2013.01); *H01L 21/3065* (2013.01); *H01L 21/31* (2013.01); *H01L 21/311* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 6,036,878 | A * | 3/2000 | Collins | 216/68 |
| 6,403,491 | B1 * | 6/2002 | Liu et al. | 438/710 |
| 6,506,685 | B2 * | 1/2003 | Li et al. | 438/710 |
| 6,716,758 | B1 * | 4/2004 | Donohoe et al. | 438/706 |
| 7,547,636 | B2 * | 6/2009 | Chi et al. | 438/714 |
| 7,682,986 | B2 * | 3/2010 | Chi et al. | 438/723 |
| 2002/0039843 | A1 * | 4/2002 | Ikeda et al. | 438/738 |
| 2002/0170881 | A1 * | 11/2002 | Benzing et al. | 216/67 |
| 2004/0000875 | A1 * | 1/2004 | Vahedi et al. | 315/111.71 |
| 2009/0081878 | A1 * | 3/2009 | Dhindsa | 438/729 |
| 2012/0061350 | A1 | 3/2012 | Dhindsa | |

FOREIGN PATENT DOCUMENTS

| | | |
|---|---|---|
| CN | 101606231 | 12/2009 |
| CN | 101809717 | 8/2010 |

OTHER PUBLICATIONS

U.S. Appl. No. 12/882,560, filed Sep. 15, 2010.

* cited by examiner

*Primary Examiner* — Stephanie Duclair
(74) *Attorney, Agent, or Firm* — Beyer Law Group, LLP (57) ABSTRACT

A method for etching features in an etch layer in a plasma processing chamber is provided. An etch gas is flowed into the plasma processing chamber. A top outer electrode is maintained at a temperature of at least 150° C. during the etching of the features. The etch gas is formed into a plasma, which etches the etch layer.

19 Claims, 7 Drawing Sheets

METHOD TO INCREASE MASK SELECTIVITY IN ULTRA-HIGH ASPECT RATIO ETCHES

BACKGROUND OF THE INVENTION

The present invention relates to etching a layer through a mask during the production of a semiconductor device. More specifically, the present invention relates to etching a dielectric layer.

During semiconductor wafer processing, features may be etched into a dielectric layer. As device sizes shrink it is more desirable to etch higher aspect ratio features. In addition, in forming memory cell arrays for DRAM, high density features are desired.

SUMMARY OF THE INVENTION

To achieve the foregoing and in accordance with the purpose of the present invention, a method for etching features in an etch layer in a plasma processing chamber is provided. An etch gas is flowed into the plasma processing chamber. A top outer electrode is maintained at a temperature of at least 150° C. during the etching of the features. The etch gas is formed into a plasma, which etches the etch layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
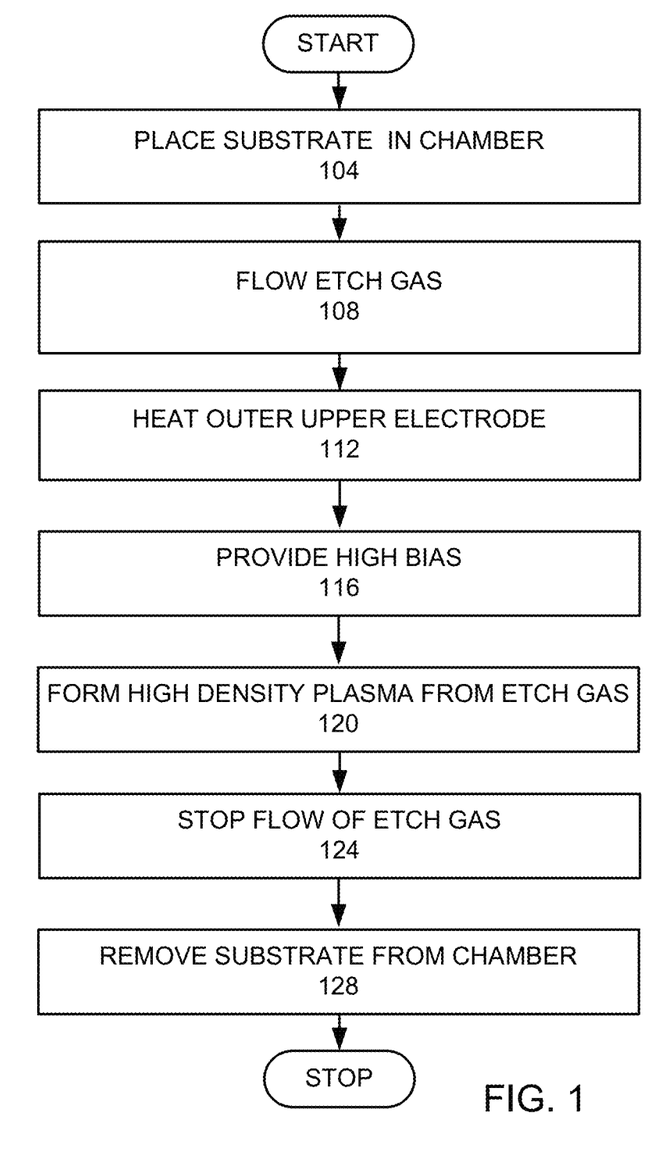
FIG. 1 is a high level flow chart of an embodiment of the invention.

To facilitate understanding, FIG. 1 is a high level flow chart of a process used in an embodiment of the invention. A substrate with a stack of an etch layer over which a mask is formed is placed in a chamber, such as a plasma processing chamber (step 104). The etch layer is etched by first flowing an etch gas into the plasma processing chamber (step 108). An upper outer electrode is heated (step 112). A high bias is provided (step 116). The etch gas is formed into a high density plasma (step 120). The flow of the etch gas is stopped (step 124). The substrate is removed from the plasma processing chamber (step 128).

EXAMPLES

Figure 2A:
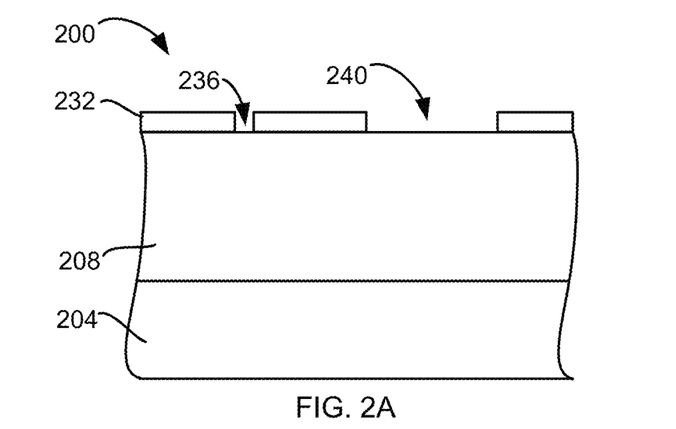
FIGS. 2A-B are schematic views of a stack processed according to an embodiment of the invention.

In an example of the invention, a substrate is placed in a plasma processing chamber (step 104). FIG. 2A is a cross-sectional view of a stack 200 with a substrate 204 over which an etch layer 208 is formed, over which a patterned mask 232 is placed. In this example, the etch layer is a dielectric material, such as silicon nitride and silicon oxide bilayer. In this example, the patterned mask 232 is a polysilicon mask and has a narrow feature 236 and a wide feature 240. One or more layers may be placed between the substrate and etch layer or the etch layer and patterned mask.

Figure 3:
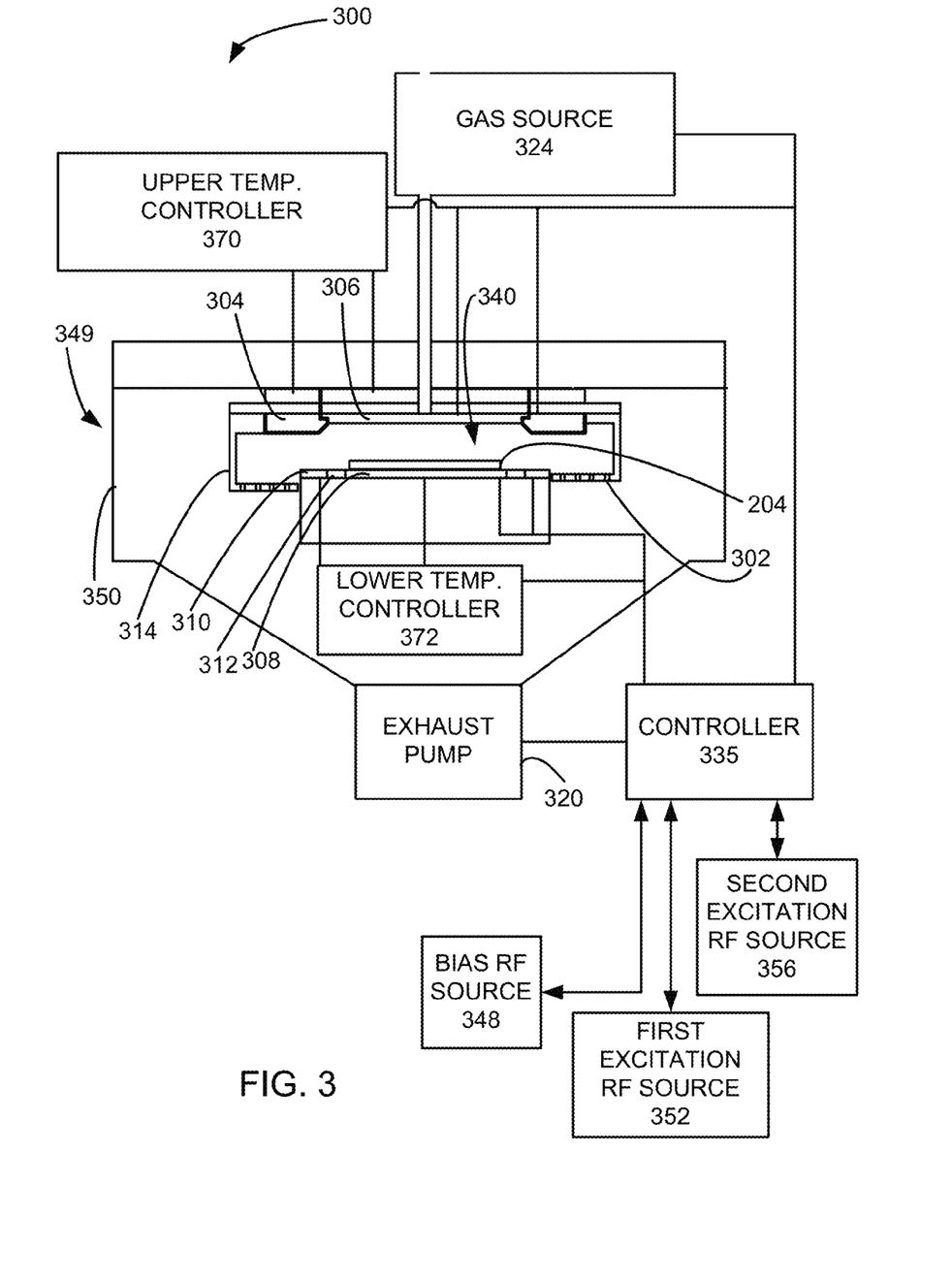
FIG. 3 is a schematic view of an etch reactor that may be used for etching.

FIG. 3 is a schematic view of an etch reactor that may be used in practicing the invention. In one or more embodiments of the invention, an etch reactor 300 comprises a top central electrode 306, top outer electrode 304, bottom central electrode 308, and a bottom outer electrode 310, within a plasma processing chamber 349, enclosed by a chamber wall 350. A bottom insulator ring 312 insulates the bottom central electrode 308 from the bottom outer electrode 310. Also within the plasma processing chamber 349, the substrate 204 is positioned on top of the bottom central electrode 308. The bottom central electrode 308 provides an electrostatic chuck (ESC) for holding the substrate 204. In this embodiment the bottom outer electrode 310 and the top outer electrode 304 have apertures that have a larger diameter than the substrate 204, so that the substrate 204 is positioned within the apertures.

A gas source 324 is connected to the plasma processing chamber 349 and supplies the etch gas into a plasma region 340 of the plasma processing chamber 349 during the etch processes.

A bias RF source 348, a first excitation RF source 352, and a second excitation RF source 356 are electrically connected to the plasma processing chamber 349 through a controller 335 to provide power to the electrodes 304, 306, 308, and 310. The bias RF source 348 generates bias RF power and supplies the bias RF power to the plasma processing chamber 349. In this example, the bias RF power has a frequency of 2 MHz. The first excitation RF source 352 generates source RF power and supplies the source RF power to the plasma processing chamber 349. In this example, this source RF power has a frequency of 27 MHz. The second excitation RF source 356 generates another source RF power and supplies the source RF power to the plasma processing chamber 349, in addition to the RF power generated by the first excitation RF source 352. In this example, this source RF power has a frequency of 60 MHz.

The different RF signals may be supplied to various combinations of the top and bottom electrodes. Preferably, the lowest frequency of the RF should be applied through the bottom electrode on which the material being etched is placed, which in this example is the bottom central electrode 308. In this example, the top electrodes are grounded and power is only provided to the bottom central electrode 308.

A C-shroud 314 extends from the top outer electrode 304 to the bottom outer electrode 310 to provide additional plasma containment. The C-shroud 314 has a plurality of apertures 302 to allow gas and plasma to flow out of the C-shroud 314. In this embodiment, the C-shroud 314 is grounded.

An upper temperature controller 370 provides independent temperature control to the top central electrode 306 and top outer electrode 304. A lower temperature controller 372 provides independent temperature control to the bottom central electrode 308 and bottom outer electrode 310. In one embodiment the top outer electrode 304 and the C-shroud 314 may be maintained at the same temperature by the same setting of the upper temperature controller 370.

The controller 335 is connected to the gas source 324, the bias RF source 348, the upper temperature controller 370, the lower temperature controller 372, the exhaust pump 320, the first excitation RF source 352, and the second excitation RF source 356. The controller 335 controls the flow of the etch gas into the plasma processing chamber 349, the chamber pressure, as well as the generation of the RF power from the three RF sources 348, 352, 356, the electrodes 304, 306, 308, and 310, and the exhaust pump 320.

The top central electrode 306 also serves as a gas distribution plate, which is connected to the gas source 324, and serves as a gas inlet for gas from the gas source 324. The exhaust pump 320 serves as a gas outlet removing gas, which passes from the top central electrode 306 through the plasma region 340 through apertures 302 to the exhaust pump 320. The exhaust pump 320 may help to control pressure.

A Flex EX+® dielectric etch system made by Lam Research Corporation™ of Fremont, Calif. may be used in a preferred embodiment of the invention. In the Flex EX+ the upper electrodes and the C-shroud are grounded.

In another embodiment, a chamber such as described in U.S. patent application Ser. No. 12/882,560, filed on Sep. 15, 2010, entitled "Method for Controlling Plasma Constituent Flux and Deposition During Semiconductor Fabrication and Apparatus for Implementing the Same" by Rajinder Dhindsa, which is incorporated by reference for all purposes, may be used. Such a chamber provides three concentric heating zones for the top electrode. In such a case, the top outer electrode of such a chamber is used like the top outer electrode in the embodiment described below.

Figure 4:
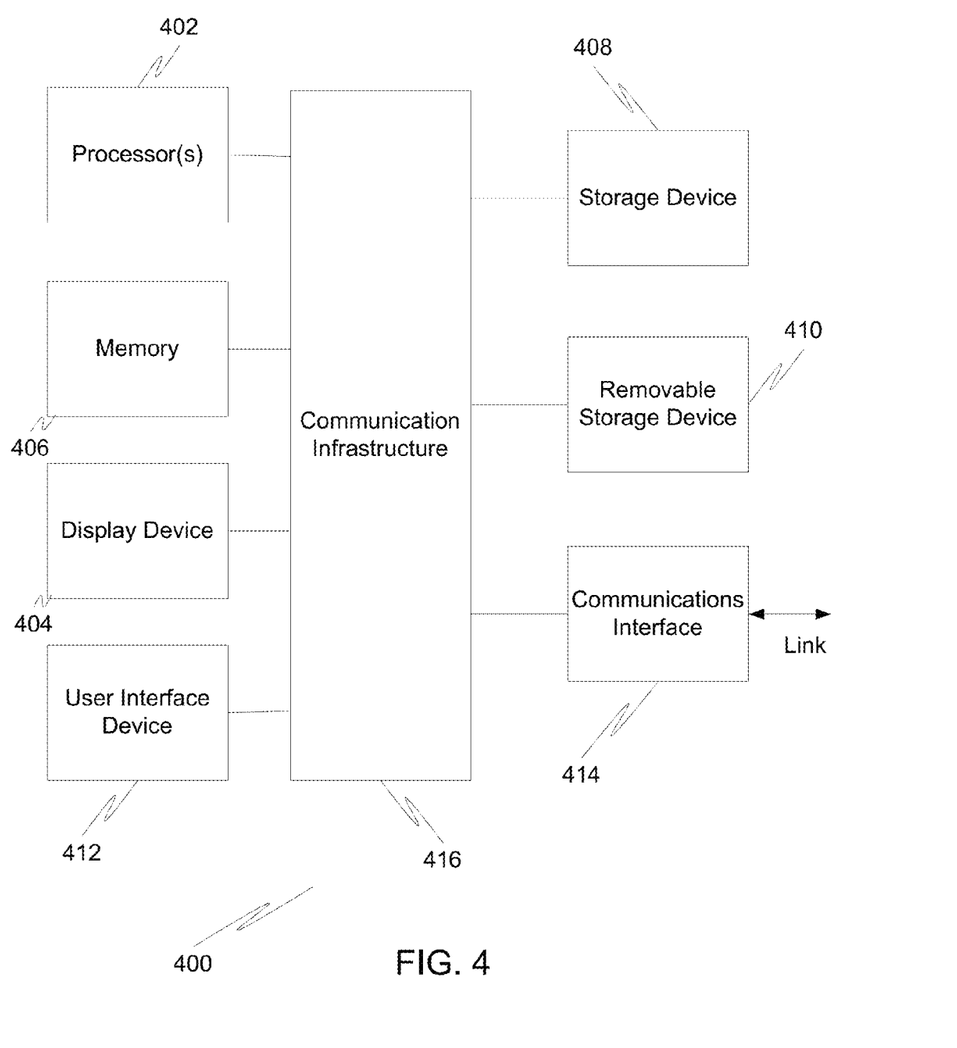
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small hand-held device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
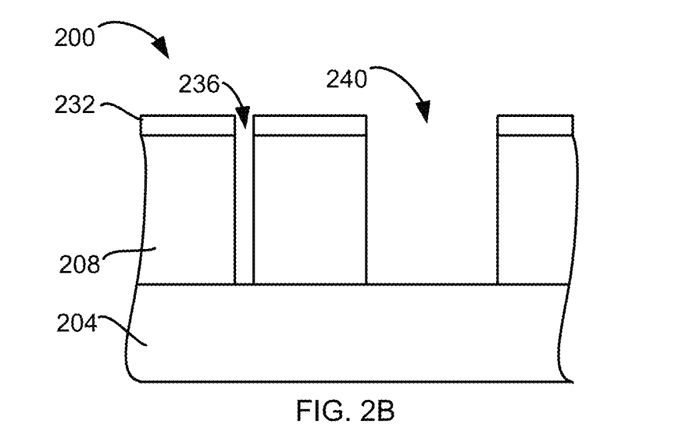

The etch layer is etched. In this embodiment, during the etch, the gap between the top central electrode and the surface of the substrate is reduced to 24 mm. The etch is accomplished by flowing an etch gas from the gas source 324 into the plasma processing chamber 349 (step 108). For a silicon oxide etch layer in this example, the etch gas may be $C_4F_6$, $NF_3$, $O_2$, and Ar. The top outer electrode 304 is heated (step 112). Preferably, the top outer electrode 304 is heated to at least 150° C. A high bias is provided (step 116). In this example, the bias is between 1500 to 2000 volts. A high density plasma is formed from the etch gas (step 120). The pressure is regulated to be 20 mTorr. Capacitive coupling is used to provide 1400 watts at 60 MHz, 2000 watts at 27 MHz, and more than 5500 watts at 2 MHz to energize to etch gas to form a plasma and to provide the bias of 1600 volts. Other embodiments may provide 4500 to 6000 watts at 2 MHz. In a preferred embodiment, during this process, the top central electrode 306 is set to a value in the range of 100° C. to 160° C., while the temperature of the top outer electrode 304 is set above 150° C. After 300 seconds, the flow of the etch gas is stopped (step 124). The substrate is then removed from the plasma processing chamber (step 128). FIG. 2B is a schematic view of the stack 200 after the etch is complete. The selectivity of the etch allows much of the mask to be retained in this example.

In an embodiment, the diameters of the holes have a CD diameter of no more than 35 nm. Embodiments of the invention eliminate or reduce aspect ratio dependent etching and reduce mask erosion thus increasing mask selectivity.

In addition, it has been unexpectedly found that for small diameters and high aspect ratio features, systematic variation through the time scale in a plasma cause etch stop. Embodiments of the invention provides a robust etch process that reduces or eliminates etch stop.

Preferably, the bias is between 1500 to 2000 volts. Bias V should not be set too high (i.e.>>threshold of etch stop) as poly mask etch rate increases with higher bias. So bias should be right above the threshold as determined through systematic experimentation. Generally, the residence time that the gas is within the plasma region, before leaving the C-shroud, is less than 12 mseconds. More preferably, the residence time is less than 10 ms. Most preferably, the residence time is less than 7 ms. Preferably, between 1000 to 3000 watts of power is provided at 27 MHz. Preferably, between 1000 to 2000 watts of power is provided at 60 MHz. Preferably, the top outer electrode is kept at a temperature above 150° C. for at least 360 seconds during the etch. More preferably, the top outer electrode is kept at a temperature above 150° C. for at least 240 seconds during the etch. Most preferably, the top outer electrode is kept at a temperature above 150° C. for at least 300 seconds during the etch.

Embodiments of the invention provide a short gas residence of less than 7 milliseconds to reduce the dissociation of the gases (i.e. reducing the amount of free fluorine from $C_4F_6$). In this example, while decreasing free fluorine, higher carbon ratio fluorocarbons are formed. It was unexpectedly found that by increasing plasma density and reducing dissociation a fast etch in high aspect ratio features is provided, while reducing mask erosion, providing a more selective etch.

An embodiment of the invention has been shown to work for feature depth to feature width aspect ratios of greater than 30:1, while eliminating the trade-off between mask selectivity and etch stop margin. Embodiments of the invention have been proven to work at aspect ratios of 50:1 and are expected to be extendable to aspect ratios of 100:1, being limited by mask preparation and bow CD requirements post dielectric etch. In another embodiment of the invention, the features are for forming devices in cell arrays for DRAM (dynamic random-access memory).

The grounding of the top electrodes and the C-shroud has been found to improve the process. Since the area of the top electrodes and the C-shroud is greater than the area of the bottom central electrode 308 and bottom outer electrode 310, the ratio of the area of the grounded surfaces versus the area of the powered surface is greater than one. More preferably the ratio of the grounded area to the powered area is greater than four. This high ratio helps to provide some of the benefits provided by embodiments of the invention. Other capacitively coupled devices may be used in other embodiments of the invention. It has been found having a ground surface area to powered surface area ratio of greater than one has improved the process. More preferably the ground surface area to powered surface area ratio of greater than four.

In addition to preventing etch stop and mask erosion, embodiments of the invention also provide high etch throughput. Embodiments of the invention also reduce or eliminate aspect ratio dependent etch.

Figure 5A:
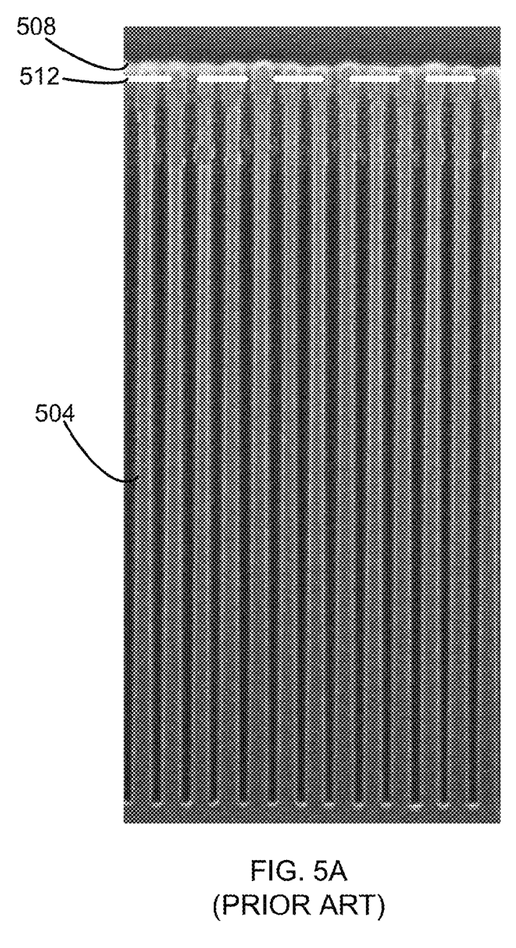
FIGS. 5A-B are cross-sectional views of dielectric etch layer that have been etched using prior art methods.
Figure 5B:
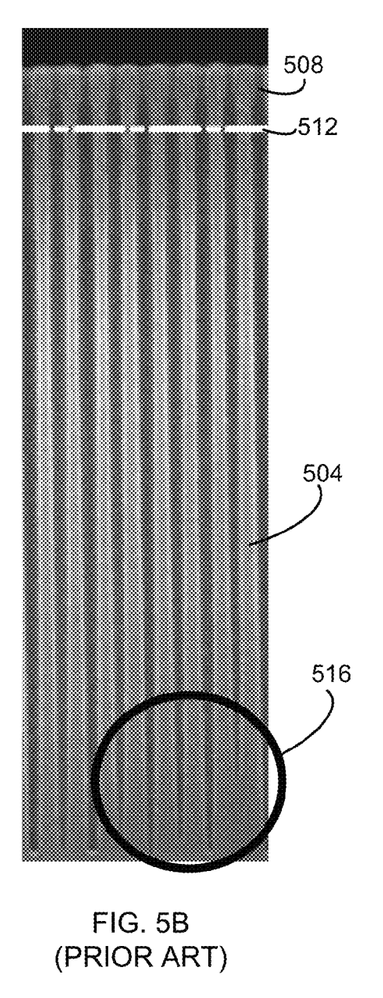

FIG. 5A is a cross-sectional view of a dielectric etch layer 504 that is etched using a prior art recipe. An example of such a recipe provides a pressure of 8 mTorr and flows a dielectric etch layer gas of 58 sccm $C_4F_6$, 59 sccm $O_2$, and 3 sccm $NF_3$. The dielectric etch gas is formed to a plasma and a bias is provided by providing 6,000 watts at 2 MHz and 900 watts at 60 MHz. An electrode gap of 34 mm is provided. The process is maintained for 410 seconds. The remaining polysilicon mask 508 is shown above the dashed line 512. Very little mask 508 remains, because this recipe provides a low selectivity. With such a low selectivity such a recipe would not be able to provide high aspect ratio contacts with aspect ratios of at least 50:1. To increase selectivity, the prior art would increase the deposition rate of passivation material on top of the mask with the expectation that this would not sacrifice the oxide etch rate in holes as much. However, as hole sizes shrink with each generation, this traditional approach failed due to the fact that mask etch rate and hole etch rate are showing responses in the same direction to changes in surface temperatures or gas flow ratios. In addition, the higher deposition rate process regimes increase etch stop, which means that in the prior art mask selectivity could not be increased without sacrificing etch stop window, or vice versa. For example, FIG. 5B is a cross-sectional view of a dielectric etch layer 504 that is etched using a more selective prior art recipe. The more selective etch recipe would use the same recipe as used for FIG. 5A, but would increase the hole etch rate by providing parameters that would increase plasma density, such as by increasing ion energy and pressure. Although ion energy is increased it should not be increased too much above threshold. A much larger amount of polysilicon mask 508 remains, as shown above the dashed line 512. This is because the etch is much more selective. The image within the circle 516 shows that some of the etched features are much shorter than other etched features. It was found that 20% of the features were under etched.

Figure 6A:
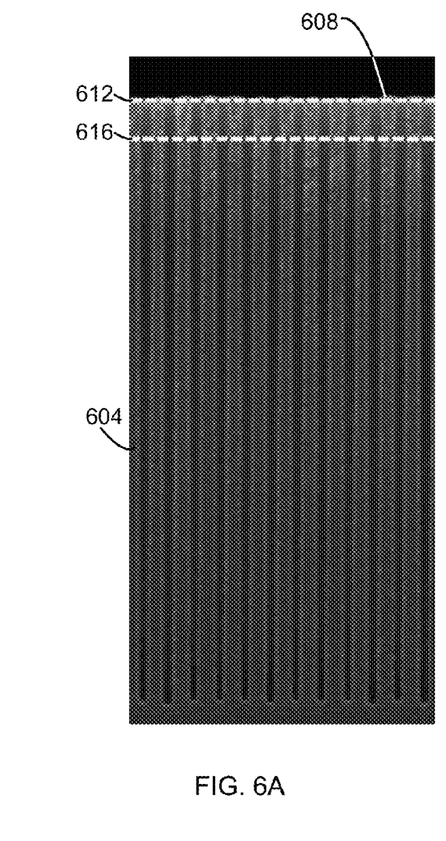
FIG. 6A is a cross-sectional view of a dielectric etch layer that has been etched using an embodiment of the invention.
Figure 6B:
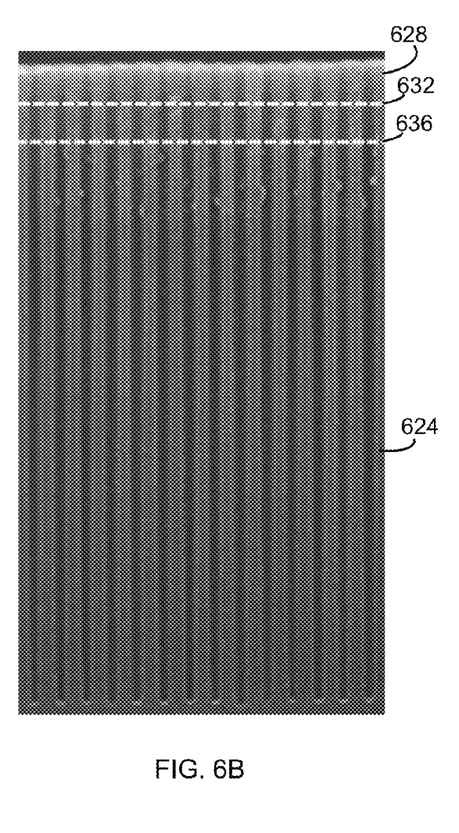
FIG. 6B is a cross-sectional view of a dielectric etch layer that has been etched according to an embodiment of the invention.

FIG. 6A shows a cross-sectional view of a dielectric etch layer 604 that is etched using the recipe for the etch illustrated in FIG. 5A, with the addition of heating and holding outer electrode and shroud at a temperature of at least 150° C. during the etch process in an embodiment of the invention. This illustrates that only a small amount of polysilicon mask 608 remains, as shown above the dashed line 612. Dashed line 616 shows the location of the interface between the polysilicon mask 608 and the etch layer 604. In contrast, FIG. 6B shows a cross-sectional view of a dielectric etch layer 624 that is etch using an embodiment of the invention using a more selective recipe that provides a pressure of 20 mTorr and flows a dielectric etch layer gas of 300 sccm Ar, 96 sccm $C_4F_6$, 72 sccm $O_2$, and 7.5 sccm $NF_3$. The dielectric etch gas is formed to a plasma and a bias is provided by providing 5,500 watts at 2 MHz, 2,000 watts at 27 MHz, and 1400 watts at 60 MHz. An electrode gap of 24 mm is provided. The process is maintained for 330 seconds. Dashed line 636 shows the location of the interface between the polysilicon mask 628 and the etch layer 624. The remaining polysilicon mask 608 is shown above the dashed line 616. As can be seen, a large amount of the mask 628 shown above dashed line 636 remains. The difference in the remaining polysilicon mask remaining in FIG. 6A and FIG. 6B is shown as the difference between dashed lines 612 and 632 and the top of mask 628. In addition, it can be seen that the bottoms of the features are even, indicating that this embodiment of the invention provides high selectivity without etch stop. It was found that in this example less than 1% of the features were under etched.

In the prior art, an array of features with aspect ratios of 50:1 would have a measurable percentage of features (10-20%) being incompletely etched. Embodiments of the invention provide features with aspect ratios of 50:1 where less than 1% (as ascertained with statistics) is incompletely etched. Electrical tests need to be performed on these structures to confirm 0% under-etch (failure rate).

Figure 7:
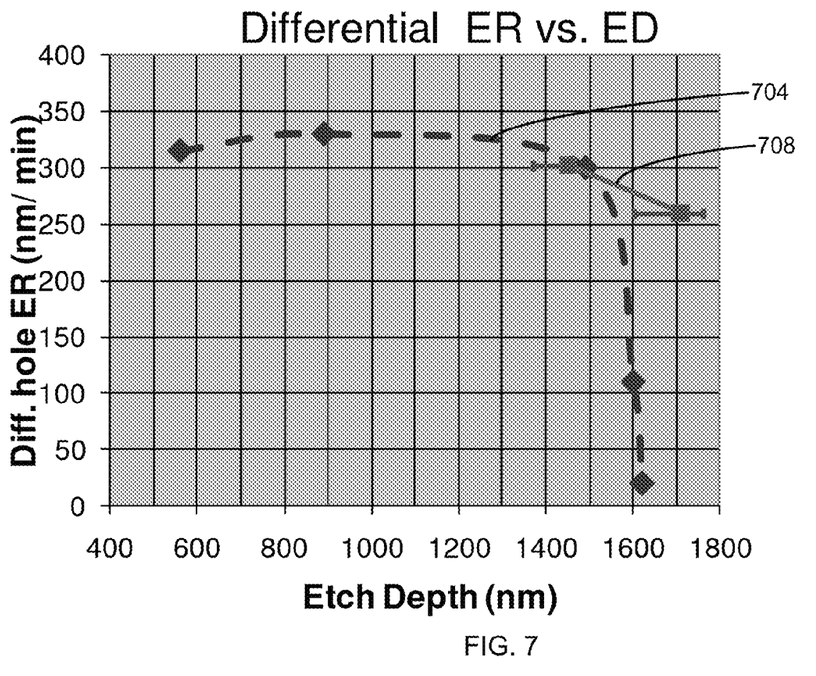
FIG. 7 is a graph of differential etch rate versus etch depth (ED).

FIG. 7 is a graph of differential etch rate versus etch depth (ED). This graph shows that the inventive process is aspect ratio (or etch depth) independent. Curve 704 is a graph of a process without heating the outer upper electrode and shroud. Curve 708 is a graph of an embodiment of the invention that provides heating to the outer upper electrode and shroud.

In addition, embodiments of the invention are able to increase the dielectric etch layer etch rate without increasing the polysilicon mask etch rate. It is proven that this process remains at steady state (or robust) for greater than 360 seconds. The upper time limit is unknown, but expected only to be limited by surface temperature control at the desired setpoints.

The invention provides a higher selectivity by increasing the hole etch rate, while not compromising the mask etch rate. This is achieved through the higher density and lower dissociation and lower residence time of the gas with the bias voltage kept above the threshold of the etch stop.

It was found that such etch stop was not caused by aspect ratio, as thought in the prior art, but instead because the etch process was not sufficiently robust and thus causing random shutting down, as indicated by the random depths of different etch stops. The finding of the random depths of different etch stops led to the hypothesis that the plasma condition was going out of tolerance of etch progression randomly, which would result in a time dependent instead of aspect ratio or CD dependent etch stop.

The apparatus in the embodiment of the invention shown in FIG. 3 provides a high plasma confinement margin, high gas conductance (up to 30 sccm/mTorr), and high Ground/Power area ratio (>>2:1) to get sufficient ion energy margin on the wafer to provide a high aspect ratio hole etch. The large Si surface area of the upper electrode and C-shroud induces significant plasma-wall (shroud) interactions that cause instability or "unsteady state" in the plasma chemistry over the entire time scale of the cell etch process. The embodiment of the invention reduces such instabilities. Embodiments of the invention increase stability to provide a steady state. Maintaining the top outer electrode at a temperature of at least 150° C. with the combination of providing a high density plasma was unexpectedly found to provide a steady state plasma.

It was unexpectedly found that by providing the high top outer electrode temperatures and high density plasma to provide a more robust plasma the resulting etch was a near ARDE-free etch, which eliminated the trade-off between mask selectivity and etch stop margin.

Other advantages of embodiments of the invention are that they provide a cost-effective solution, in that embodiments of the invention do not require complex hardware to provide RF pulsing. In addition, embodiments of the invention are scalable down to about 23 nm holes (shown with data in FIG. 6B) with aspect ratios of 60:1. Scalability is only limited by mask preparation and bow CD requirements, post dielectric etch. Because of the much higher selectivity obtained with this new method, thinner masks may be used to start with and reduce risk of loss of structural integrity during the mask preparation process.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching features in a dielectric etch layer disposed below a mask in a plasma processing chamber, comprising:
   flowing an etch gas into the plasma processing chamber;
   maintaining a top outer electrode at a temperature of at least 150° C. during the etching of the features;
   forming the etch gas into a high density plasma that is contained using a shroud that extends from the top outer electrode to a bottom electrode and forms a "C" shaped profile, which etches the etch layer, and
   providing a grounded area to powered area ratio of greater than four.

2. The method, as recited in claim 1, wherein the etch gas flows into and out of the plasma processing chamber in less than 12 msec.

3. The method, as recited in claim 2, further comprising maintaining a pressure of at least 20 mTorr.

4. The method, as recited in claim 3, further comprising providing a bias of at least 1500 volts.

5. The method, as recited in claim 4, wherein the forming the etch gas into the plasma uses capacitive coupling to form the etch gas into the plasma.

6. The method, as recited in claim 5, wherein the capacitive coupling provides power through at least one bottom electrode and wherein a top central electrode and the top outer electrode are grounded.

7. The method, as recited in claim 1 wherein the forming the etch gas into the plasma provides a steady state for at least 360 seconds.

8. The method, as recited in claim 7, wherein some of the features have aspect ratios of at least 30:1 and CD on no more than 35 nm.

9. The method, as recited in claim 1, wherein the dielectric layer is at least one of silicon nitride or silicon oxide.

10. The method, as recited in claim 9, wherein the dielectric layer is a silicon nitride and silicon oxide bilayer.

11. The method, as recited in claim 10, wherein some of the features have aspect ratios of at least 30:1 and CD on no more than 35 nm.

12. The method, as recited in claim 11, wherein some of the features have aspect ratios of at least 50:1 and wherein less than 1% of the features have etch stop.

13. The method, as recited in claim 9, wherein some of the features have aspect ratios of at least 30:1 and CD on no more than 35 nm.

14. The method, as recited in claim 13, wherein some of the features have aspect ratios of at least 50:1 and wherein less than 1% of the features have etch stop.

15. The method, as recited in claim 1, further comprising maintaining a pressure of at least 20 mTorr.

16. The method, as recited in claim 1, further comprising providing a bias of at least 1500 volts.

17. A method of etching features in a dielectric etch layer disposed below a mask in a plasma processing chamber comprising a top central electrode, a top outer electrode surrounding the top central electrode, a bottom central electrode, and a bottom outer electrode surrounding the bottom central electrode, comprising:
   flowing an etch gas into the plasma processing chamber;
   maintaining the top outer electrode at a temperature of at least 150° C. during the etching of the features;
   forming the etch gas into a high density plasma that is contained within a shroud that extends from the top outer electrode to the bottom outer electrode and forms a "C" shaped profile, which etches the etch layer, and
   providing a grounded area comprising the top outer electrode and the shroud, and providing a powered area comprising the bottom electrode, wherein the grounded area to powered area ratio is greater than four.

18. The method, as recited in claim 17, wherein the shroud comprises a plurality of apertures to allow gas and plasma to flow out of the shroud.

19. The method, as recited in claim 17, wherein the grounded area further comprises the top central electrode.

* * * * *